US008560991B1

(12) United States Patent
Fuss

(10) Patent No.: US 8,560,991 B1
(45) Date of Patent: Oct. 15, 2013

(54) AUTOMATIC DEBUGGING USING AUTOMATIC INPUT DATA MUTATION

(75) Inventor: Shai Fuss, Rosh Haayin (IL)

(73) Assignee: Cadence Design Systems, Inc., San Jose, CA (US)

( * ) Notice: Subject to any disclaimer, the term of this patent is extended or adjusted under 35 U.S.C. 154(b) by 480 days.

(21) Appl. No.: 12/898,253

(22) Filed: Oct. 5, 2010

(51) Int. Cl.
G06F 17/50 (2006.01)
G01R 31/28 (2006.01)
G01R 31/30 (2006.01)
G01R 27/28 (2006.01)
G06F 11/00 (2006.01)
G01R 31/08 (2006.01)
G01R 31/02 (2006.01)

(52) U.S. Cl.
CPC ........ *G06F 17/5081* (2013.01); *G06F 17/5022* (2013.01); *G06F 11/00* (2013.01); *G01R 31/08* (2013.01); *G01R 31/02* (2013.01); *G01R 31/28* (2013.01); *G01R 31/30* (2013.01); *G01R 27/28* (2013.01)
USPC ............. 716/112; 713/106; 713/136; 713/52; 713/54; 703/16; 714/33; 714/732; 714/744; 702/117; 324/528; 324/750.17

(58) Field of Classification Search
CPC . G06F 17/5081; G06F 17/5022; G06F 11/00; G01R 31/08; G01R 31/02; G01R 31/28; G01R 31/30; G01R 31/14; G01R 27/28
USPC ................ 716/112, 106, 136, 52, 54; 703/16; 714/33, 732, 744; 702/117; 324/528, 324/750.17
See application file for complete search history.

(56) References Cited

U.S. PATENT DOCUMENTS

| 6,063,132 | A  | * | 5/2000  | DeCamp et al. ............... 716/112 |
| 6,304,095 | B1 | * | 10/2001 | Miyamoto ............... 324/754.03 |
| 7,225,377 | B2 | * | 5/2007  | Ishida et al. .................. 714/738 |
| 7,228,515 | B2 | * | 6/2007  | Querbach et al. ............. 716/108 |
| 7,478,346 | B2 | * | 1/2009  | Hsu et al. ....................... 716/104 |
| 8,032,806 | B1 | * | 10/2011 | Tabatabaei .................... 714/727 |

(Continued)

FOREIGN PATENT DOCUMENTS

JP    11163063 A  *  6/1999

OTHER PUBLICATIONS

Zeller, Andreas, "Chapter 5—Simplifying Problems, Why Programs Fail: A Guide to Systematic Debugging," Morgan Kaufman, 2006, 25 pages.

*Primary Examiner* — Phallaka Kik
(74) *Attorney, Agent, or Firm* — Holland & Knight LLP; Mark H. Whittenberger

(57) ABSTRACT

Embodiments provide systems, devices, methods, and machine-readable medium for automated debugging of a design under test in a verification environment as part of electronic design automation. Embodiments may automatically identify inputs that are relevant to a bug for a device under test. A failing test run may be taken and rerun several times with small changes in the inputs. If the test is passing, the mutated inputs may be important to reproduce the bug and may be marked as "suspicious". The result of this process may be a list of suspicious inputs and a shorter and simpler test that still fails. The shorter test may be rerun and fields of the inputs recorded. New tests may be created with mutated fields. Mutated fields that result in passing tests may be considered suspicious fields. Suspicious inputs and fields may be presented to a user as part of an electronic design process.

28 Claims, 14 Drawing Sheets

(56) References Cited

U.S. PATENT DOCUMENTS

| | | | |
|---|---|---|---|
| 8,136,082 B2* | 3/2012 | Desineni et al. | 716/136 |
| 2004/0216061 A1* | 10/2004 | Floyd et al. | 716/4 |
| 2005/0102596 A1* | 5/2005 | Hekmatpour | 714/741 |
| 2005/0216246 A1* | 9/2005 | Liau | 703/14 |
| 2006/0085774 A1* | 4/2006 | Moorby | 716/5 |
| 2007/0174805 A1* | 7/2007 | Hsu et al. | 716/18 |
| 2009/0044160 A1* | 2/2009 | Bueti et al. | 716/6 |
| 2009/0119624 A1* | 5/2009 | Chess et al. | 716/5 |
| 2009/0178015 A1* | 7/2009 | Federovsky et al. | 716/3 |
| 2009/0241080 A1* | 9/2009 | Yang et al. | 716/6 |
| 2010/0107132 A1* | 4/2010 | Bjesse | 716/5 |
| 2010/0169849 A1* | 7/2010 | Trombley et al. | 716/4 |
| 2011/0131030 A1* | 6/2011 | McCoy et al. | 703/14 |
| 2011/0214096 A1* | 9/2011 | Sheeley et al. | 716/107 |

* cited by examiner

AUTOMATIC DEBUGGING USING AUTOMATIC INPUT DATA MUTATION

BACKGROUND

Embodiments generally relate to systems, devices, and methods for circuit design. More particularly, embodiments generally relate to systems, devices, and methods for automating the debugging of design models and verification environments for simulated hardware designs as part of electronic design automation.

Modern circuit design of integrated circuits (ICs) is a combination of automated design and debug of the design. ICs are often automatically designed using specialized computer program code that serves as simulation of the IC. The design of complex ICs generally requires a high level of design verification before millions of dollars are committed to the manufacture of the ICs. Design verification typically includes running a verification program on a design, often referred to as a design under test (DUT). Much of the verification may be carried out by simulation of the DUT at a logical level, where the DUT is modeled with one or more hardware description languages (HDLs).

A verification environment (VE) may be created to simulate the DUT, check the responses from the simulated DUT, and collect coverage information used to measure the degree to which the DUT was exercised during verification. VEs are typically written in one or more verification languages, such as e, System Verilog, or SystemC.

Failures in a DUT are often encountered during simulation of the DUT by the VE. The failures typically indicate potential problems with the DUT or the VE. The output of failure information may form an important part of the verification process as the failure information may reveal design errors of the DUT and/or the VE that need to be debugged and fixed before an IC is fabricated. Each piece of failure information output from a verification process is typically examined and diagnosed in an attempt to ensure that no errors are overlooked prior to fabrication.

The process of diagnosing failures in a DUT during the verification process is typically referred to as debugging. Verification engineers typically examine raw data from a set of verification tests (often referred to as "runs") in an attempt to locate and fix bugs in a DUT. Debugging a DUT is typically a challenging intellectual process that traditionally has been conducted by expert engineers. Continuously running simulations generates a relatively large amount of failure data to be reviewed for DUT debug by a team of design verification experts, technicians, and the like devoted to debugging. Due to the relatively large amount of data generated by running a simulation of a DUT, these engineers and technicians may spend relatively large amount of time and mental effort to analyze data to locate bugs. The debug process is a bottleneck in the design process, which affects engineering costs and schedules for moving IC to market.

BRIEF SUMMARY

Embodiments thus provide debugging methods, systems, and devices that automate portions of the debugging process typically performed by the designers and the verification engineers. Embodiments provide systems, devices, methods, and computer-readable medium for automated debugging of a design under test in a verification environment. Embodiments may involve automated debugging of a design under test in a verification environment as part of electronic design automation (EDA). Embodiments may identify inputs that are relevant to bugs for a DUT. Embodiments may take a failing run that involves inputs and rerun it several times with changes or mutations in the inputs. If the test is still failing, the mutated inputs may not be relevant to the failure and may be removed from the test. If the test is passing, the mutated inputs may be important to reproduce the bug and may be marked as "suspicious". The result of this process may be a list of suspicious inputs or transactions and a shorter and simpler test that still fails. This shorter test may be called herein a short or a simple test. The shorter test may then be rerun and fields of the suspicious inputs recorded. New tests may be created with each field mutated. Mutated fields that result in passing tests may be considered suspicious fields. Suspicious inputs and fields may be presented to a user as part of an electronic design process.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments provide systems, devices, methods, and machine-readable storage medium that provide for automated debugging of a design under test in a verification environment. Some embodiments may involve automated debugging of a design under test in a verification environment as part of electronic design automation. Embodiments may identify inputs that are relevant to a bug for a DUT. Embodiments may take a failing run and rerun it several times with small changes or mutations in the inputs. If the test is still failing, the mutated inputs may not be relevant to the failure and may be removed from the test. If the test is passing, the mutated inputs may be important to reproduce the bug and may be marked as "suspicious". The result of this process may be a list of suspicious inputs or transactions and a shorter and simpler test that still fails. This shorter test may be called herein a short or a simple test. The shorter test may then be rerun and fields of the suspicious inputs recorded. New tests may be created with each field mutated. Mutated fields that result in passing tests may be considered suspicious fields. Suspicious fields and/or inputs may be presented to a user as part of an electronic design process.

Figure 1A:
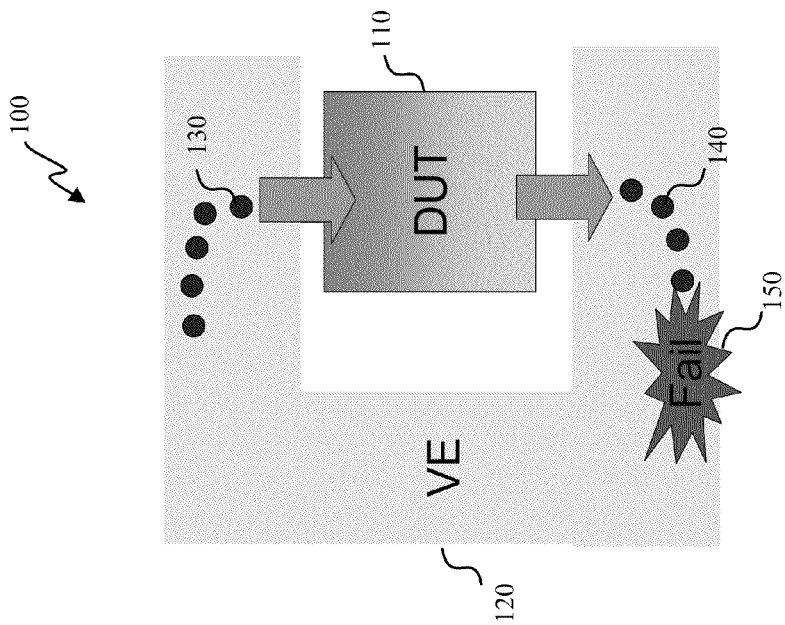
FIG. 1A illustrates a block diagram of a system for automatic debugging of a device under test in a verification environment in accordance with various embodiments.

FIG. 1A shows a system 100 in accordance with various embodiments involving an automatic debugger for designs under test in a verification environment. System 100 includes a design under test (DUT) 110 within a verification environment (VE) 120. Verification environment 120 may be used to simulate and verify design under test 110. In order to verify DUT 110, VE 120 may drive inputs 130 into DUT 110 and check the outputs 140. Inputs 130 may be part of a test. Inputs may be generated by the verification environment. Outputs 140 may show different problems, such as DUT errors or unexpected behavior. For example, output 150 shows "Fail," which may reflect a DUT error.

Figure 1B:
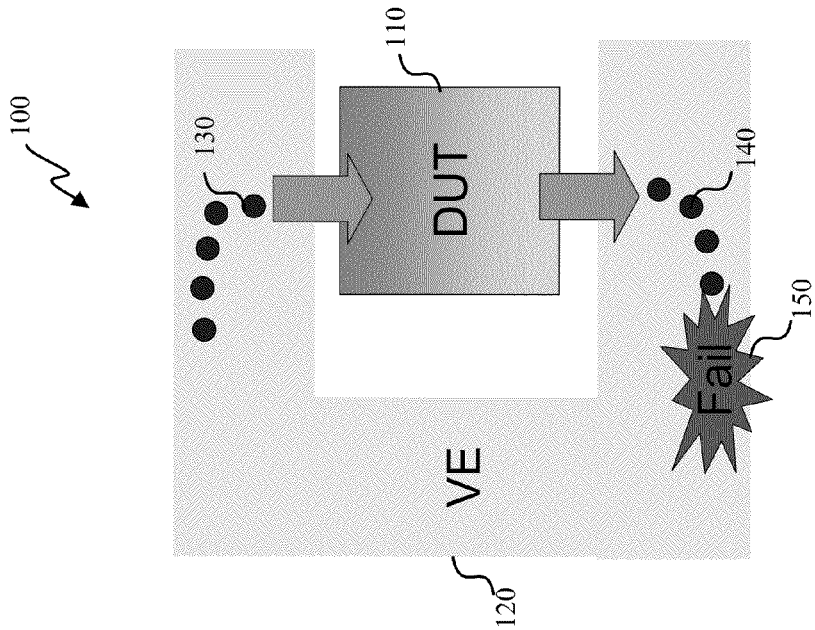
FIG. 1B illustrates a block diagram of a system for automatic debugging of a device under test in a verification environment in accordance with various embodiments.
Figure 1C:
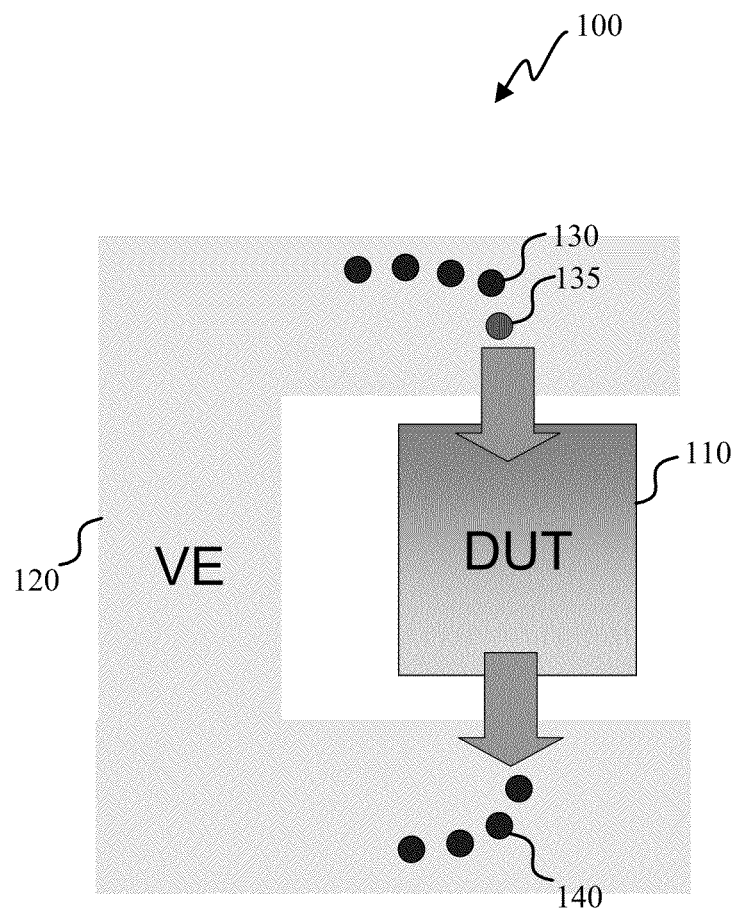
FIG. 1C illustrates a block diagram of a system for automatic debugging of a device under test in a verification environment in accordance with various embodiments.

System 100 shows inputs 130, which may be referred to as data items or transactions. Inputs 130 may also be called packets in some embodiments. Each input may have different attributes or fields, as shown in instructions 160. In some embodiments, VE 120 may drive different random inputs 130 through DUT 110 and then record outputs 140. For example, FIG. 1B shows an embodiment where different random inputs are generated using instructions 170. Outputs 140 include a DUT error represented as "Fail" 150. FIG. 1C then shows inputs 130 driven through DUT 110 again, but in this case, one of the inputs, 135, has been changed. In some cases, input 135 may be altered. For example, a field or attribute of the input may be altered. In some cases, the input 135 may actually be removed. These tests may be used to determine which inputs may play a role in causing the DUT error, or failed test. For example, using altered input 135 results in a passing test rather than a failing test as shown in FIGS. 1A and 1B.

Merely by way of example, inputs 130 may be part of a test. Simulation tests thus generally include the VE 120 simulating DUT 110 and collecting data output such as output 140 from DUT 110 where the output may be resultant of the simulation. For example, a DUT such as DUT 110 may include a video circuit, an audio circuit, an I/O circuit, a processor circuit, and the like. The VE, such as VE 120, may be configured to simulate the DUT in a variety of ways to test one or more of these circuits during a test run as will be well known by those of skill in the art. It is understood that the systems, methods, devices, and computer-readable medium discussed herein are not limited for use to such exemplary DUT.

Figure 2A:
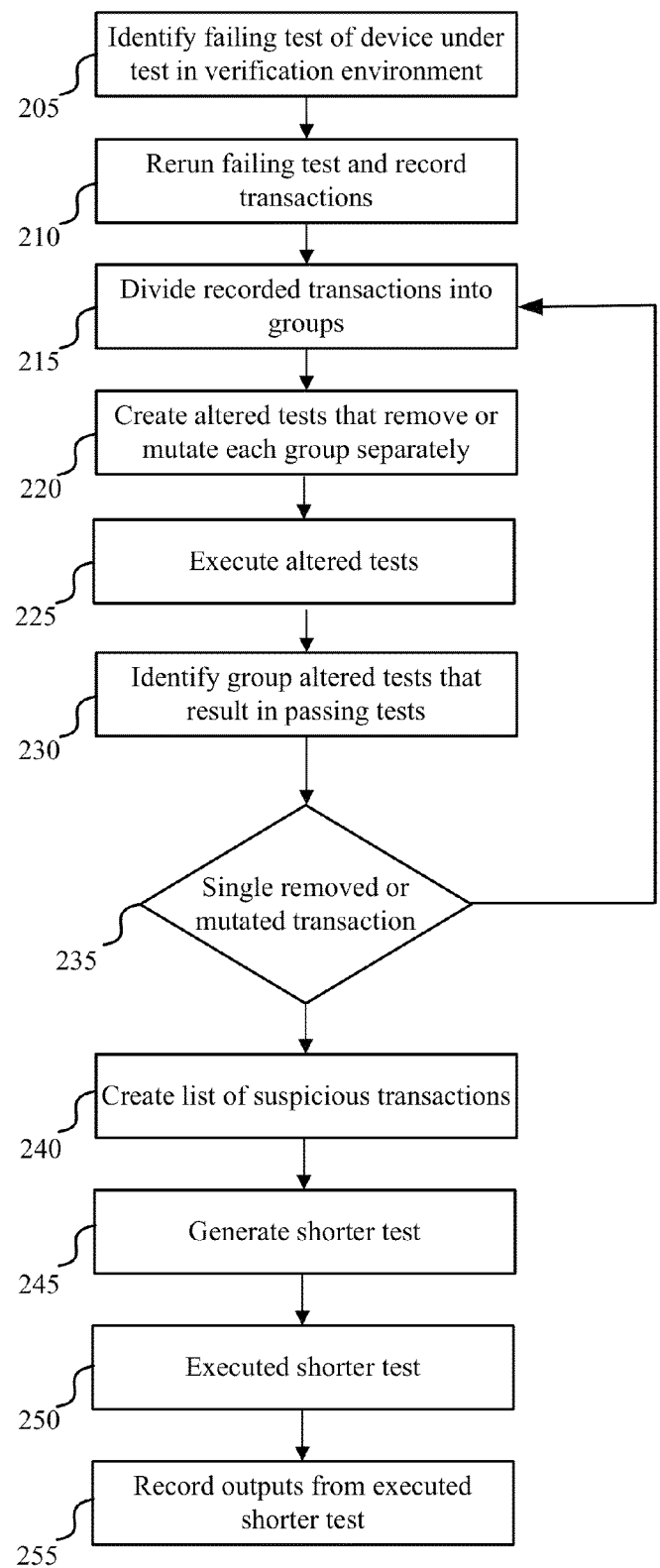
FIG. 2A illustrates a block diagram of a method for automatic debugging of a device under test in a verification environment in accordance with various embodiments.

FIG. 2A provides a flow diagram of a method 200 of automatic debugging of a design under test in a verification environment, in accordance with various embodiments. Method 200 may be implemented in a system such as system 100, or systems 400 and/or 500 provided below. Method 200 may be implemented to provide an automated way of determining suspicious transactions for a design under test in a verification environment.

At block 205, a failing test of the design under test in the verification environment is determined or identified. The failing test may include multiple transactions. In some embodiments, transactions may also be referred to as inputs and/or packets. Each transaction may include different attributes, which may also be referred to as fields. In some embodiments, the inputs may be generated by the verification environment.

At block 210, the failing test may be rerun and transactions recorded. At block 215, the recorded transactions may be divided into different groups. The groups may be based on different factors. For example, transaction groupings may come from the same physical input, or transactions that share a common structure (e.g. Ethernet transactions vs. USB transactions), merely by way of example. Grouping may also be based on transactions being related in some other way.

At block 220, new tests may be created that involve removing and/or mutating different transactions from a group. Each group may be altered as such separately. As a result, multiple group altered tests of the design under test in the verification environment may be generated. Each group altered test may include the groups determined at block 215 with at least one of the groups altered in the respective group altered test. In some embodiments, an altered group may be referred to as a mutated group, where some aspect of the group is changed. For example, a transaction that is part of a group may be mutated in some embodiments. In some embodiments, a transaction of a group may be removed. In some embodiments, a group altered test may include removing an entire group of the respective test. In some embodiments, a group may include a single transaction.

At block 225, the group altered tests of the design under test may be executed in the verification environment. Results from the executed group altered tests may then be recorded. At block 230, group altered tests that may result in failing or passing group altered tests may be identified. In particular, those group altered tests that result in passing tests may be identified. In some embodiments, the mutated or removed transaction for a group altered test that results in a passing test may be identified.

At block 235, it may be determined whether a group altered test that results in a passing test involves a single mutated or removed transaction. In some embodiments, the steps performed in blocks 215 to 230 may be repeated until altered group tests that involve a single mutated or removed input are determined. This may involve a process of creating subgroups from the groups that have been mutated resulting in passing tests.

At block 240, a list of suspicious transactions may be determined. The list may include the list of transactions such that when each transaction is removed or mutated, the failing test is eliminated. The list may be transmitted to a user in some embodiments.

Figure 2B:
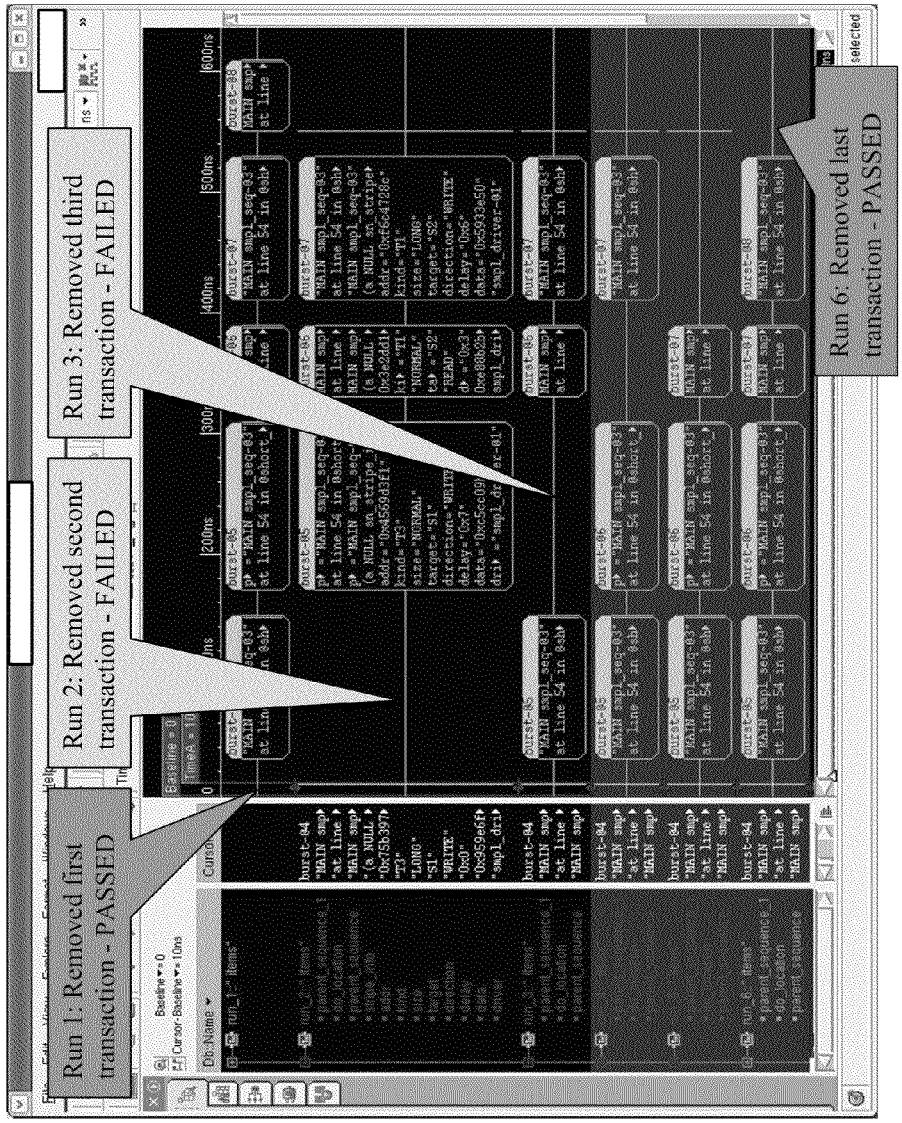
FIG. 2B shows a computer screenshot of aspects of a method for automatic debugging of a device under test in a verification environment in accordance with various embodiments.

One example of method 200 is shown in FIG. 2B. The original test included 6 transactions. For this example, the automatic debugger reran it 6 times (Run 1, Run 2, Run 3, . . . Run 6), where each time it removed a single transaction. The first transaction was removed in Run 1. The second transaction was removed in Run 2, and so on. Only Run 1 and Run 6 passed, therefore transactions #1 and #6 are marked as "suspicious".

Some embodiments of method 200 of automatic debugging of a design under test in a verification environment may also include creating shorter tests. For example, method 200 may involve removing all the transactions that were not found to be suspicious and leaving in the test only the suspicious transactions. At block 245, a shorter test may thus be generated. The shorter test may include one or more transactions that result in a passing test when the transaction is either mutated or removed from a group or subgroup. At block 250, the shorter test of the design under verification may be executed. In some embodiments, outputs from the executed shorter test may be recorded as seen in block 255.

Figure 2C:
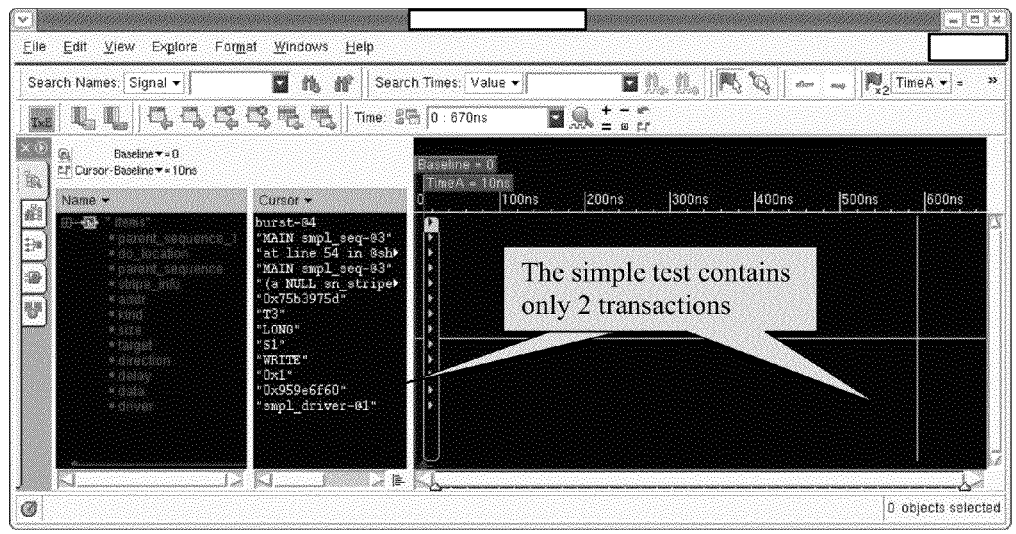
FIG. 2C shows a computer screenshot of aspects of a method for automatic debugging of a device under test in a verification environment in accordance with various embodiments.

One example of creating a shorter test is shown in FIG. 2C. In this example, only the first and last transactions were found to be suspicious in the example of method 200 shown in FIG. 2B. An automatic debugger in accordance with various embodiments may remove all other transactions and the test still failed. Embodiments of an automatic debugger may create a shorter test that manages to reproduce the failure with just two transactions in this example.

Figure 3A:
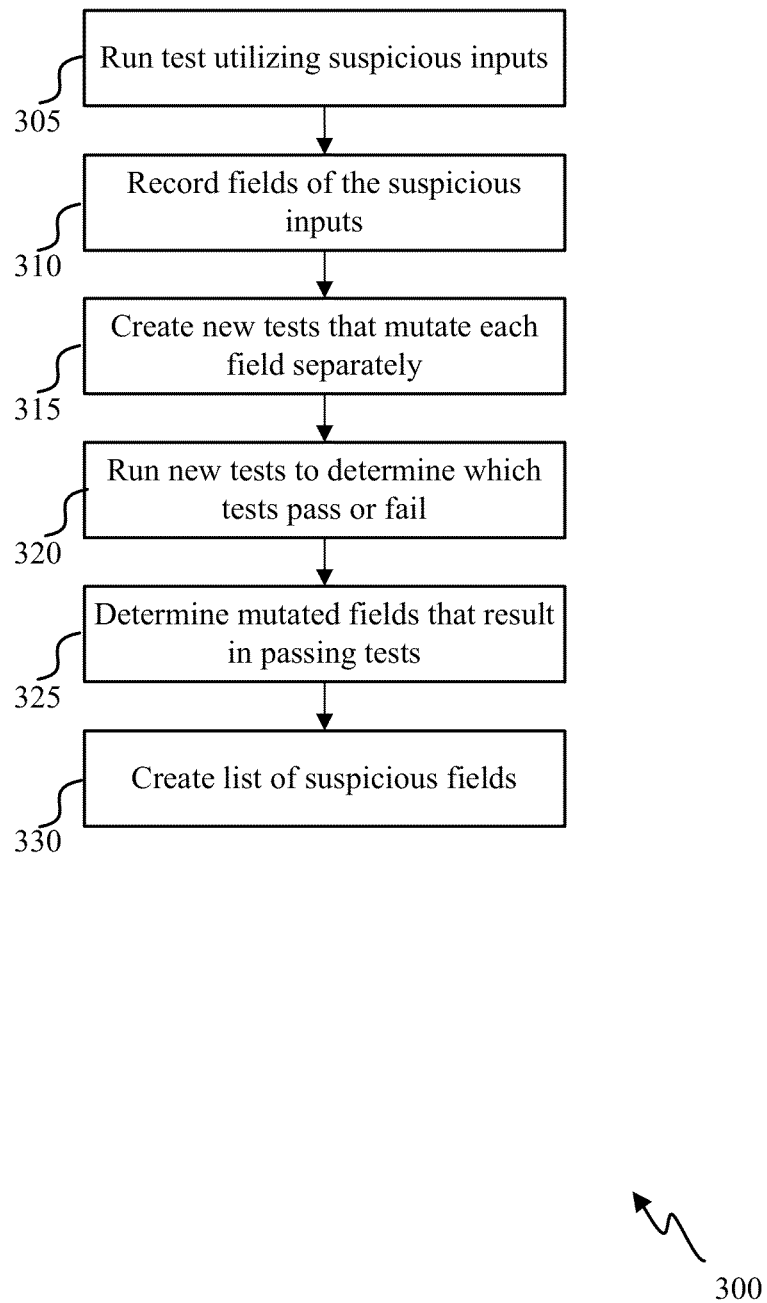
FIG. 3A illustrates a block diagram of a method for automatic debugging of a device under test in a verification environment in accordance with various embodiments.

FIG. 3A provides a block diagram showing aspects of a method 300 of automatic debugging of a design under test in a verification environment, in accordance with various embodiments. Method 300 may be implemented in a system such as system 100, or systems 400 and/or 500 provided below. Method 300 may be implemented in conjunction with methods such as method 200. Method 300 may utilize tests involving suspicious transactions that may be determined using method 200 of FIG. 2, for example.

At block 305, a test that includes suspicious inputs that result in a failing test when utilized may be rerun. In some embodiments, such a test may be a shorter test as found in method 200. At block 310, one or more fields, which may also be referred to as attributes, from the suspicious inputs of the failing test may be determined.

At block 315, one or more new tests may be generated. These tests may be referred to as field altered tests. Each test may involve altering one or more fields determined at block 310. In some embodiments, each field may be altered or mutated separately. In some embodiments, multiple fields may be altered for a specific test.

At block 320, the field altered tests may be executed through the design under verification in the verification environment to determine which tests pass or fail. At block 325, the mutated fields that result in passing tests may be determined. In some embodiments, these mutated fields that result in passing tests may be considered suspicious fields.

At block 330, a list of suspicious fields may be created. The list of suspicious fields may be transmitted to a user. In some embodiments, the suspicious fields and/or the suspicious transactions from the passing tests may be provided to a user computer for storage, display, and/or use in an interactive debug session of the design under test.

Figure 3B:
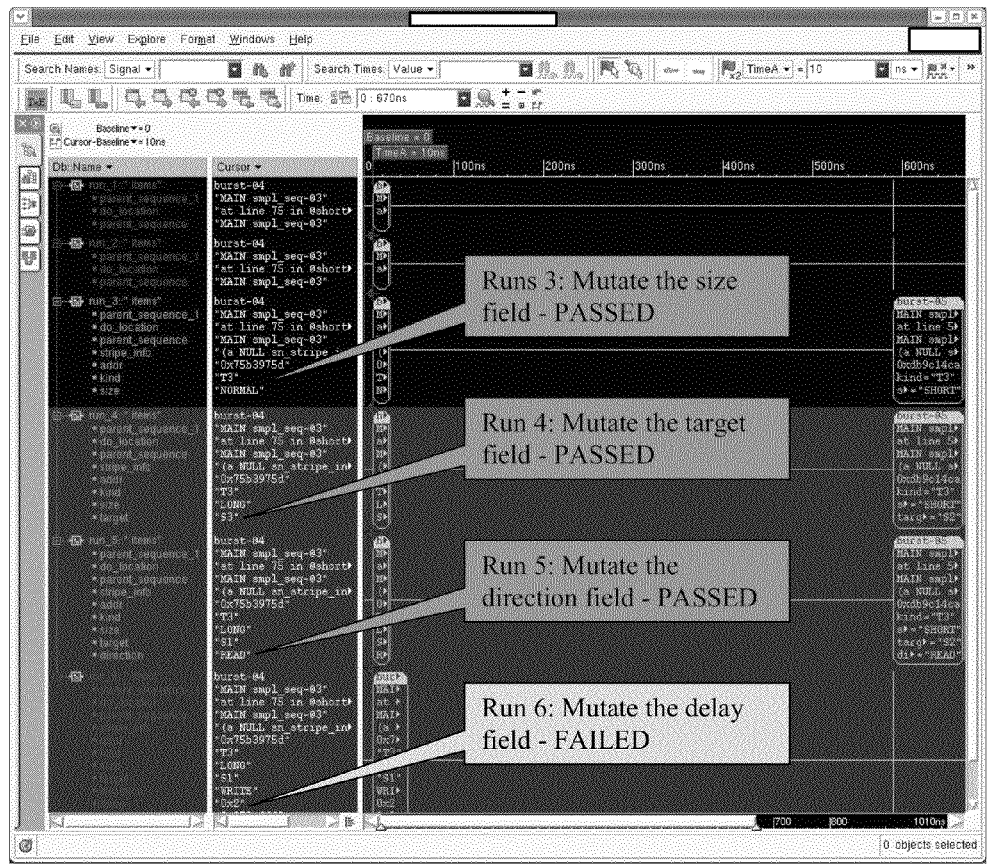
FIG. 3B shows a computer screenshot of aspects of a method for automatic debugging of a device under test in a verification environment in accordance with various embodiments.

FIG. 3B provides a screenshot of an embodiment providing an example of finding suspicious fields. In this example, Run 3 mutated the size field, Run 4 mutated the target field, Run 5 mutated the direction field; each of these mutations of a field resulted in a passing test. In Run 6, the delay field was mutated resulting in a failed test. As a result, in this example, an automatic debugger found that in order to reproduce the fail, the first transaction has: Size=LONG, Direction=WRITE and Target=S1. Note that for this example, changing the address, kind and delay fields did not influence the fail.

Figure 4:
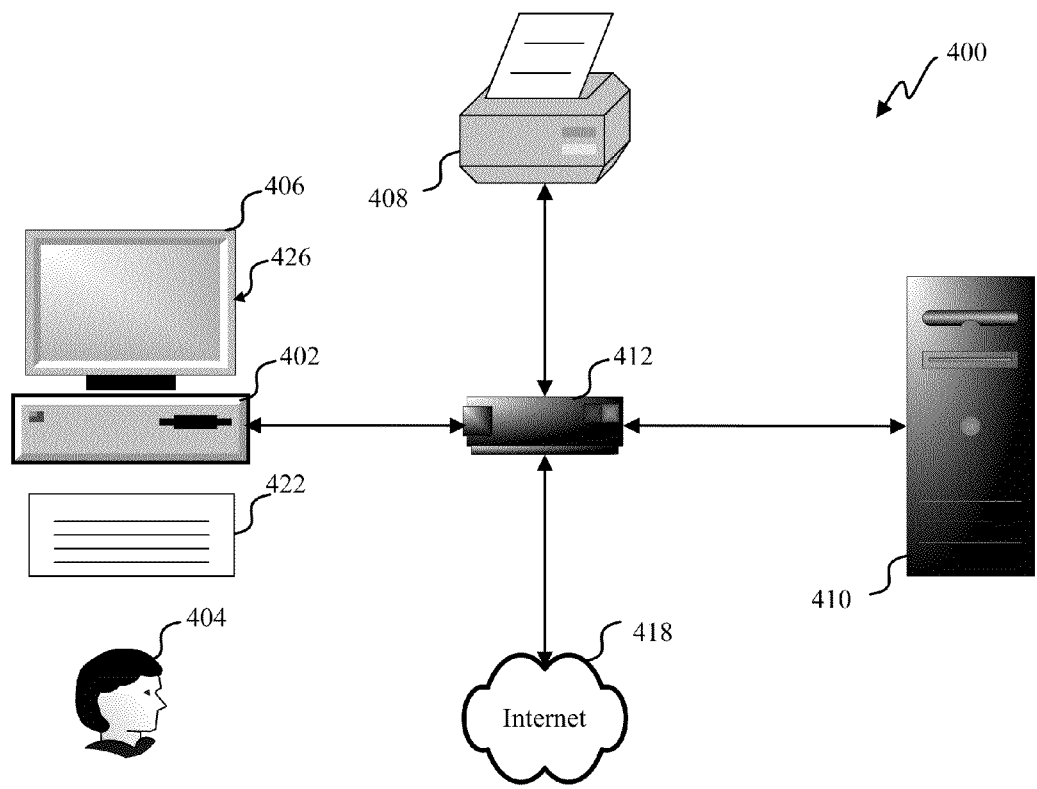
FIG. 4 depicts a block diagram of an embodiment of a CAD system in accordance with various embodiments.

Referring next to FIG. 4, an exemplary environment with which embodiments may be implemented is shown with a computer aided design (CAD) system 400 that can be used by a designer 404 to design, for example, electronic circuits as part of electronic design automation. The CAD system 400 can include a computer 402, keyboard 422, a network router 412, a printer 408, and a monitor 406. The monitor 406, processor 402, and keyboard 422 are part of a computer system 426, which can be a laptop computer, desktop computer, handheld computer, mainframe computer, etc. The monitor 406 can be a cathode ray tube (CRT), flat screen, etc.

A circuit designer 404 can input commands into the processor 402 using various input devices, such as a mouse, keyboard 422, track ball, touch screen, etc. If the CAD system 400 comprises a mainframe, a designer 404 can access the computer 402 using, for example, a terminal or terminal interface. Additionally, the computer system 426 may be connected to a printer 408 and a server 410 using a network router 412, which may connect to the Internet 418 or a WAN.

The server 410 may, for example, be used to store additional software programs and data. In one embodiment, software implementing the systems and methods described herein can be stored on a storage medium in the server 410. Thus, the software can be run from the storage medium in the server 410. In another embodiment, software implementing the systems and methods described herein can be stored on a storage medium in the computer 402. Thus, the software can be run from the storage medium in the computer system 426. Therefore, in this embodiment, the software can be used whether or not computer 402 is connected to network router 412. Printer 408 may be connected directly to computer 402, in which case, the computer system 426 can print whether or not it is connected to network router 412.

Figure 5:
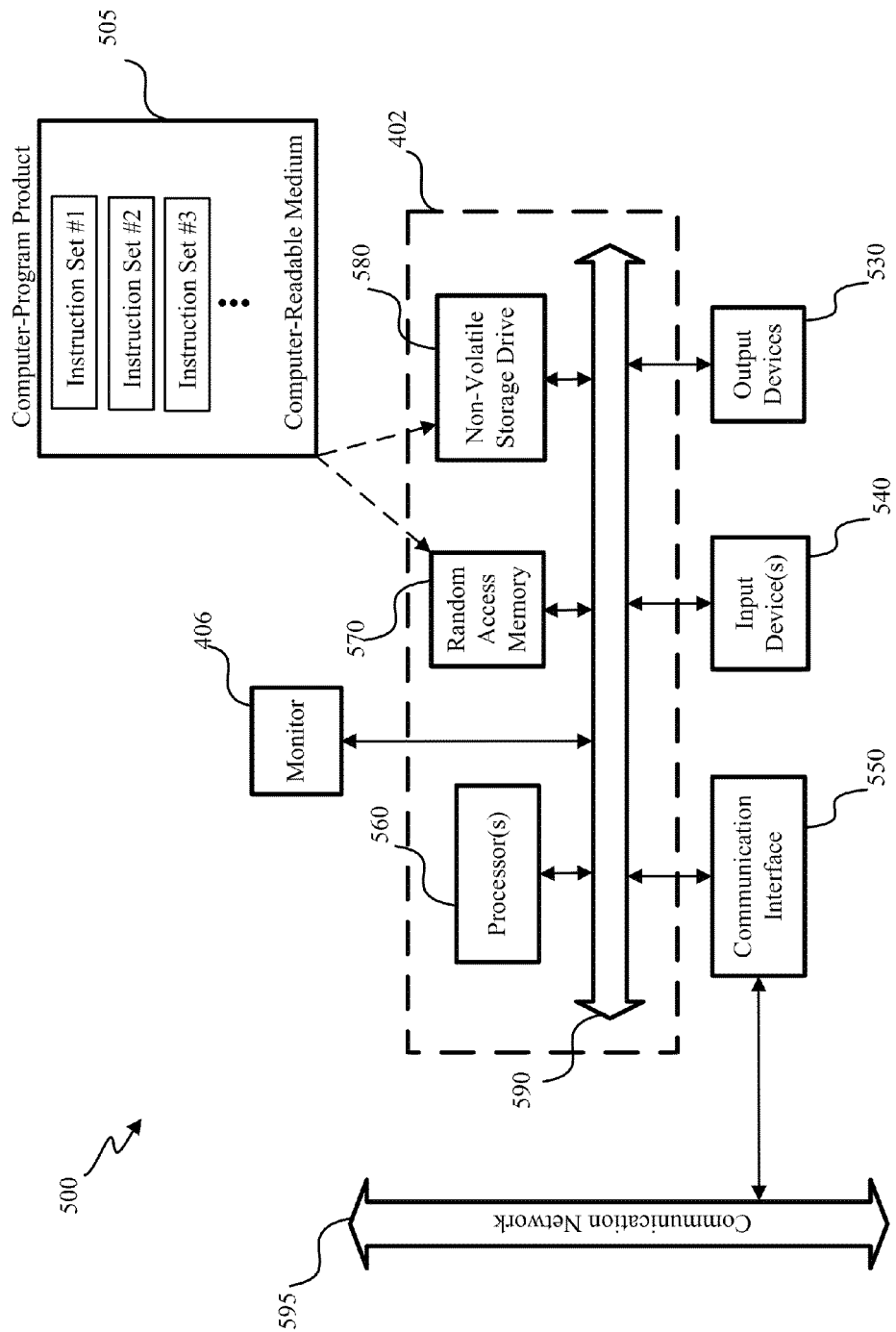
FIG. 5 depicts a block diagram of an embodiment of a special-purpose computer in accordance with various embodiments.

With reference to FIG. 5, an embodiment of a special-purpose computer system 500 is shown. The methods above and below may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general-purpose computer system 426, it is transformed into the special-purpose computer system 500 for CAD.

Special-purpose computer system 500 comprises a computer 402, a monitor 406 coupled to computer 402, one or more additional user output devices 530 (optional) coupled to computer 402, one or more user input devices 540 (e.g., keyboard, mouse, track ball, touch screen) coupled to computer 402, an optional communications interface 550 coupled to computer 402, and a computer-program product 505 stored in a tangible computer-readable memory in computer 402. Computer-program product 505 directs system 500 to perform the above-described methods. Computer 402 may include one or more processors 560 that communicate with a number of peripheral devices via a bus subsystem 590. These peripheral devices may include user output device(s) 530, user input device(s) 540, communications interface 550, and a storage subsystem, such as random access memory (RAM)

570 and non-volatile storage drive 580 (e.g., disk drive, optical drive, solid state drive), which are forms of tangible computer-readable memory.

Computer-program product 505 may be stored in non-volatile storage drive 580 or another computer-readable medium accessible to computer 402 and loaded into memory 570. Each processor 560 may comprise a microprocessor, such as a microprocessor from Intel® or Advanced Micro Devices, Inc.®, or the like. To support computer-program product 505, the computer 402 runs an operating system that handles the communications of product 505 with the above-noted components, as well as the communications between the above-noted components in support of the computer-program product 505. Exemplary operating systems include Windows® or the like from Microsoft Corporation, Solaris® from Sun Microsystems, LINUX, UNIX, and the like.

User input devices 540 include all possible types of devices and mechanisms for inputting information to computer system 402. These may include a keyboard, a keypad, a mouse, a scanner, a digital drawing pad, a touch screen incorporated into the display, audio input devices such as voice recognition systems, microphones, and other types of input devices. In various embodiments, user input devices 540 are typically embodied as a computer mouse, a trackball, a track pad, a joystick, wireless remote, a drawing tablet, and a voice command system. User input devices 540 typically allow a user to select objects, icons, text and the like that appear on the monitor 406 via a command such as a click of a button or the like. User output devices 530 include all possible types of devices and mechanisms for outputting information from computer 402. These may include a display (e.g., monitor 406), printers, non-visual displays such as audio output devices, etc.

Communications interface 550 provides an interface to other communication networks 595 and devices and may serve as an interface for receiving data from and transmitting data to other systems, WANs and/or the Internet 418. Embodiments of communications interface 550 typically include an Ethernet card, a modem (telephone, satellite, cable, ISDN), a (asynchronous) digital subscriber line (DSL) unit, a FireWire® interface, a USB® interface, a interface, a wireless network adapter, and the like. For example, communications interface 550 may be coupled to a computer network, to a FireWire® bus, or the like. In other embodiments, communications interface 550 may be physically integrated on the motherboard of computer 402, and/or may be a software program, or the like.

RAM 570 and non-volatile storage drive 580 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only memories (ROMs), battery-backed volatile memories, networked storage devices, and the like. RAM 570 and non-volatile storage drive 580 may be configured to store the basic programming and data constructs that provide the functionality of various embodiments, as described above.

Software instruction sets that provide the functionality of the present invention may be stored in RAM 570 and non-volatile storage drive 580. These instruction sets or codes may be executed by the processor(s) 560. RAM 570 and non-volatile storage drive 580 may also provide a repository for storing data and data structures used in accordance with the present invention. RAM 570 and non-volatile storage drive 580 may include a number of memories including a main random access memory (RAM) for storage of instructions and data during program execution and a read-only memory (ROM) in which fixed instructions are stored. RAM 570 and non-volatile storage drive 580 may include a file storage subsystem providing persistent (non-volatile) storage for program and/or data files. RAM 570 and non-volatile storage drive 580 may also include removable storage systems, such as removable flash memory.

Bus subsystem 590 provides a mechanism for letting the various components and subsystems of computer 402 to communicate with each other as intended. Although bus subsystem 590 is shown schematically as a single bus, alternative embodiments of the bus subsystem may utilize multiple busses or communication paths within the computer 402.

Some embodiments may thus include a system, such as systems 400 or 500, for automated debugging of a design under test in a verification environment of electronic design automation. The system may include one or more storage mediums, such as storage device 580, RAM 570, and/or a memory contained within computer 402 and/or server 410. The system may include a processor coupled with the storage medium. The processor may be a processor such as processor 560 and/or a processor contained within computer 402 and/or server 410. The processor may be configured for automated debugging of a design under test in a verification environment of electronic design automation by a configuration to: identify a failing test of the design under test in the verification environment; determine multiple inputs of the failing test where the verification environment creates the multiple inputs; generate multiple altered tests of the design under test in the verification environment, where each altered test includes the multiple inputs with at least one input altered in the respective altered test; execute in the multiple altered tests of the design under test in the verification environment; and identify at least one executed altered test from the multiple altered tests that result in passing altered test.

Some embodiments of the system for automated debugging of a design under test in a verification environment of electronic design automation may include a processor that is further configured to: divide the multiple inputs of the failing test into multiple groups; generate a multiple group altered tests of the design under test in the verification environment with each group altered test including the multiple groups with at least one group altered in the respective group altered test; execute the multiple group altered tests of the design under test in the verification environment; and identify at least one executed group altered test from the multiple group altered tests that result in a passing group altered test.

Some embodiments of the system for automated debugging of a design under test in a verification environment of electronic design automation may include a processor that is further configured to: determine the at least one group altered in at least one passing group altered test; divide the at least one determined group into multiple subgroups; generate multiple subgroup altered tests, where each subgroup altered tests includes the multiple groups with at least one subgroup from the at least one determined group altered in the subgroup altered test; execute the multiple subgroup altered tests of the design under test in the verification environment; and identify at least one subgroup altered test from the multiple subgroup altered tests that result in passing subgroup test. In some embodiments, the processor may be further configured to repeat these steps until at least one determined group includes a single input that results in a passing subgroup test.

Some embodiments of the system for automated debugging of a design under test in a verification environment of electronic design automation of claim may include a processor that is further configured to generate a shorter test that includes at least one input that results in a passing subgroup test when either removed or modified from the passing tests; and execute the shorter test of the design under test in the verification environment.

Some embodiments of the system for automated debugging of a design under test in a verification environment of electronic design automation may include a processor that is further configured to: determine multiple fields of a shorter test, where the one or more inputs of the shorter test include the multiple fields; generate multiple field altered tests, where each field altered test includes the shorter test with at least one of fields of the multiple fields altered; execute in the verification environment the multiple field altered tests of the design under verification; determine the executed field altered tests that result in passing tests; and provide the inputs and fields that result in passing tests to a user computer for at least storage, display, or use in an interactive debug session of the design under test.

Some embodiments of the system for automated debugging of a design under test in a verification environment of electronic design automation may include a processor configured to alter at least one group in the respective modified test, including removing at least one group in the respective modified test. Some embodiments of the system for automated debugging of a design under test in a verification environment of electronic design automation may include a processor configured to alter a field that includes changing a value of a field. Some embodiments of the system for automated debugging of a design under test in a verification environment of electronic design automation may include a processor configured to divide the multiple inputs of the failing test into multiple groups, where each of the multiple groups consists of one of the multiple inputs.

Some embodiments of the system for automated debugging of a design under test in a verification environment of electronic design automation may include a processor configured to alter at least one input of an altered test by removing the inputs. Some embodiments of the system may include modifying at least one input in the respective altered test.

Some embodiments of the system for automated debugging of a design under test in a verification environment of electronic design automation may include a processor configured to execute the failing test of the design under test in the verification test; and recording the multiple inputs of the executed failing test.

Figure 6A:
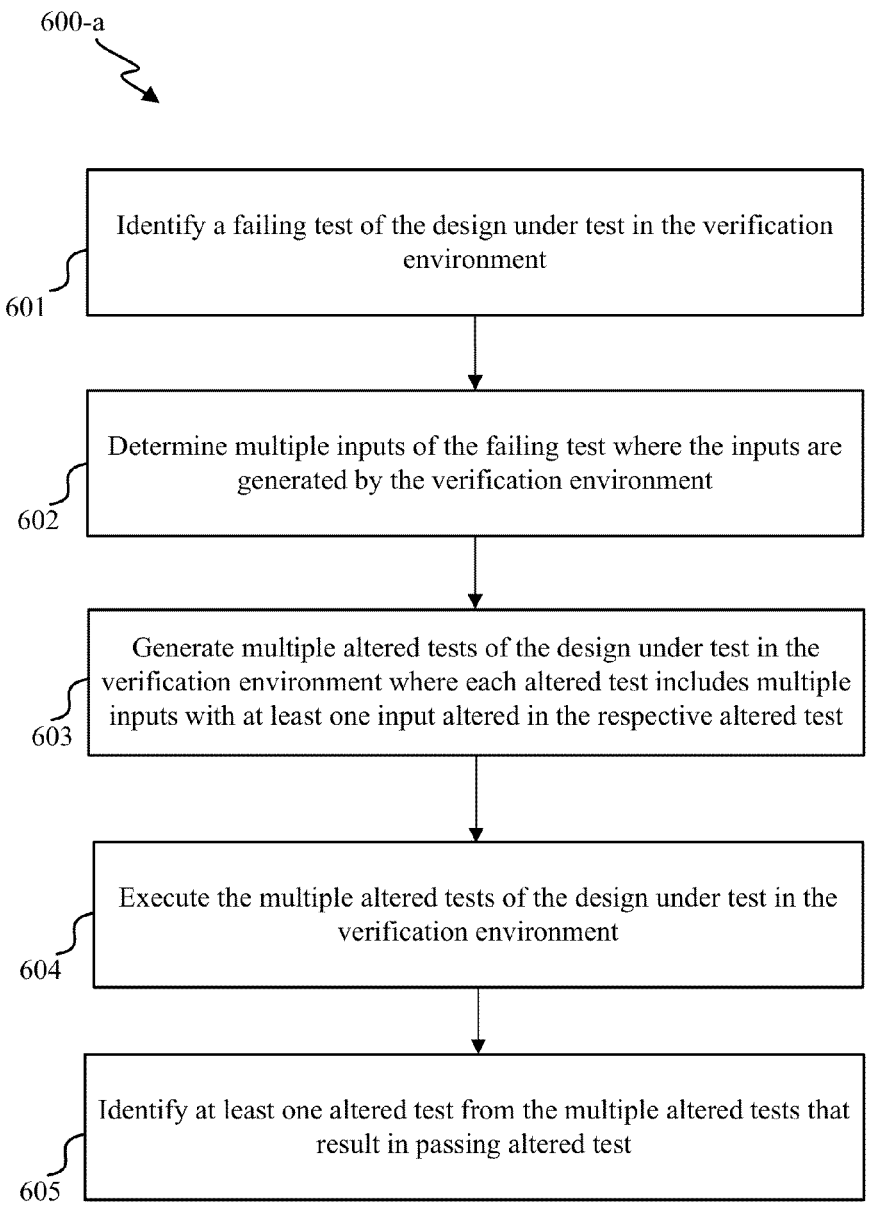
FIG. 6A illustrates a block diagram of a method for automatic debugging of a device under test in a verification environment in accordance with various embodiments.

FIG. 6A provides a block diagram of a method 600-*a* of an automated debugging of a design under test in a verification environment of electronic design automation in accordance with various embodiments. Method 600-*a* may be implemented on systems such as systems 100, 400 and/or 500, merely by way of example. At block 601, a failing test of the design under test in the verification environment may be identified. At block 602, multiple inputs of the failing test may be determined where the inputs are generated by the verification environment. At block 603, multiple altered tests of the design under test in the verification environment may be generated where each altered test includes multiple inputs with at least one input altered in the respective altered test. At block 604, the multiple altered tests of the design under test in the verification environment may be executed. At block 605, at least one altered test from the multiple altered tests that result in passing altered test may be identified.

Some embodiments of the methods 600 for automated debugging of a design under test in a verification environment of electronic design automation may alter the at least one input of an altered test by removing the inputs. Some embodiments of the methods 600 may include modifying the at least one input in the respective altered test.

Some embodiments of methods 600 for automated debugging of a design under test in a verification environment of electronic design automation may include re-executing the failing test of the design under test in the verification environment. In some embodiments, the multiple inputs of the executed failing test may be recorded.

Figure 6B:
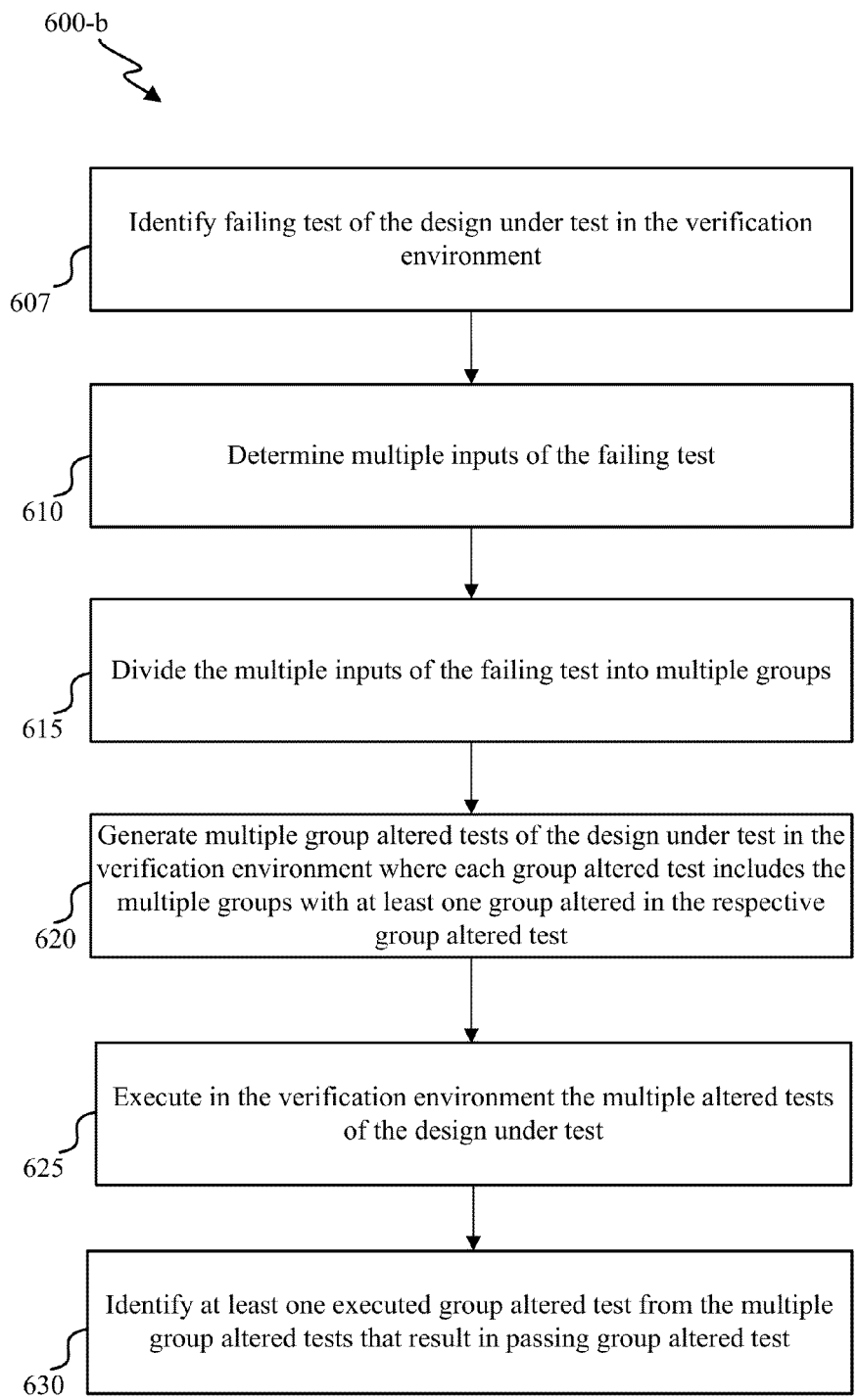
FIG. 6B illustrates a block diagram of a method for automatic debugging of a device under test in a verification environment in accordance with various embodiments.

FIG. 6B provides a block diagram of a method 600-*b* of automated debugging of a design under test in a verification environment of electronic design automation in accordance with various embodiments. Method 600-*b* may be implemented on systems such as systems 100, 400 and/or 500, merely by way of example. Method 600-*b* may be utilized in some embodiments in conjunction with method 600-*a*. At block 607, a failing test of the design under test in the verification environment may be identified. At block 610, multiple inputs of the failing test may be determined. At block 615, the multiple inputs of the failing test may be divided into multiple groups. In some embodiments, each of the multiple groups may consist of one of the multiple inputs. At block 620, multiple group altered tests of the design under test in the verification environment may be generated. Each group altered test may include the multiple groups with at least one group altered in the respective group altered test. In some embodiments, altering at least one group in the respective modified test includes removing at least one group in the respective modified test. At block 625, in the verification environment, the multiple group altered tests of the design under test may be executed. At block 630, at least one executed group altered test from the multiple group altered tests that result in passing group altered tests may be identified.

Figure 6C:
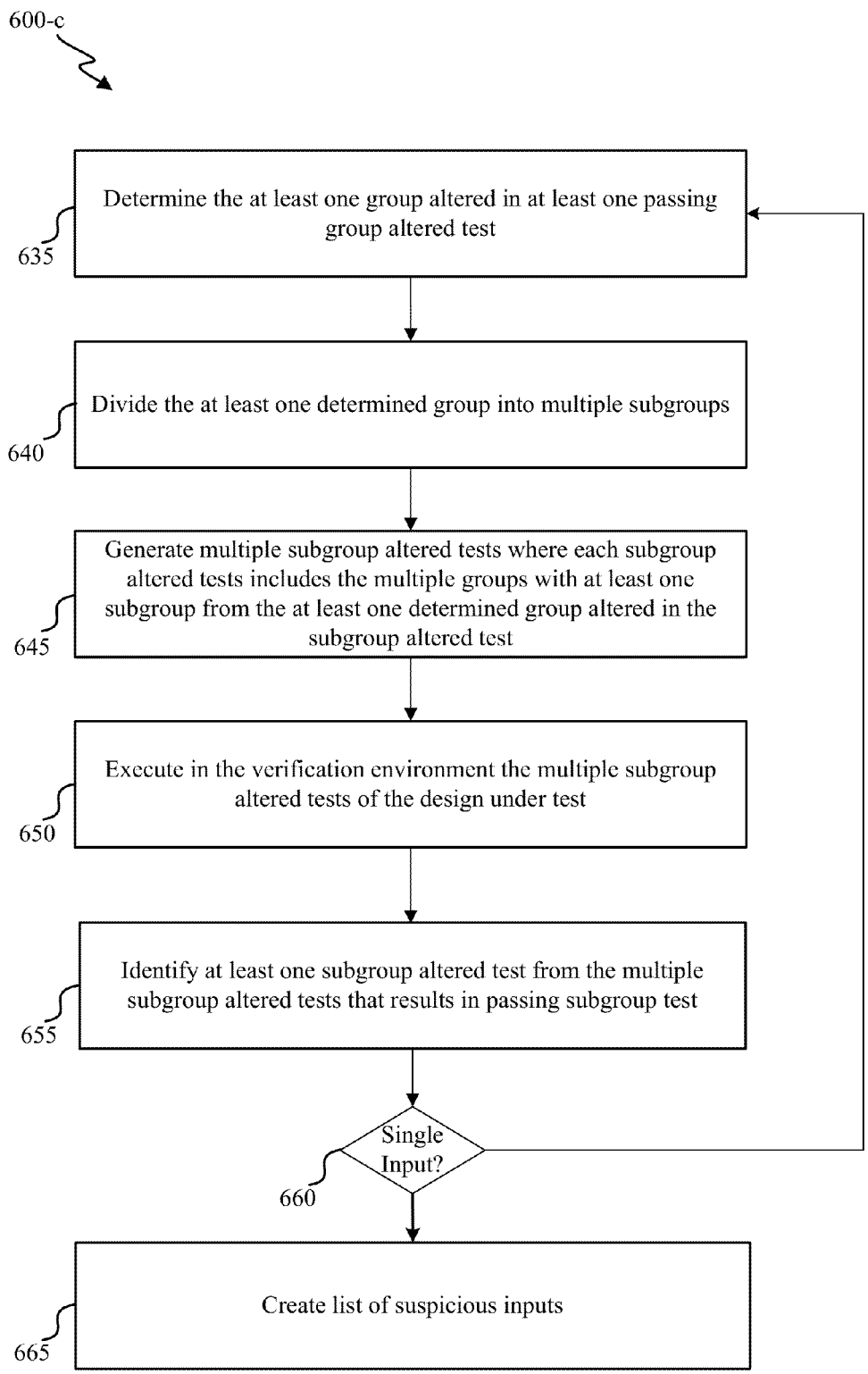
FIG. 6C illustrates a block diagram of a method for automatic debugging of a device under test in a verification environment in accordance with various embodiments.

FIG. 6C provides a block diagram of a method 600-*c* of automated debugging of a design under test in a verification environment of electronic design automation in accordance with various embodiments. Method 600-*c* may be implemented on systems such as systems 100, 400 and/or 500, merely by way of example. Method 600-*c* may be utilized in some embodiments in conjunction with method 600-*a* and/or 600-*b*. At block 635, at least one group altered in at least one passing group altered test may be determined. At block 640, the at least one determined group may be divided into multiple subgroups. At block 645, multiple subgroup altered tests may be generated. Each subgroup altered tests may include the multiple groups with at least one subgroup from the at least one determined group altered in the subgroup altered test. At block 650, in the verification environment, the multiple subgroup altered tests of the design under test may be executed. At block 655, at least one subgroup altered test from the multiple subgroup altered tests that result in passing subgroup test may be identified.

In some embodiments, method 600-*c* may include repeating the steps of blocks 635, 640, 645, 650, and/or 655 until at least one determined group includes a single input that results in a passing subgroup test. In some embodiments, this may involve decision block, such as block 660. In some embodiments, a list of suspicious inputs may be determined and/or created then at block 665.

Some embodiments of the method for automatic debugging of a design under test in a verification environment of electronic design automation may also include generating a shorter test including at least one input that results in a passing subgroup test when altered from the passing tests. In the verification environment, the shorter test of the design under test may be executed, which may be of use in methods such as method 600-*d* described next.

Figure 6D:
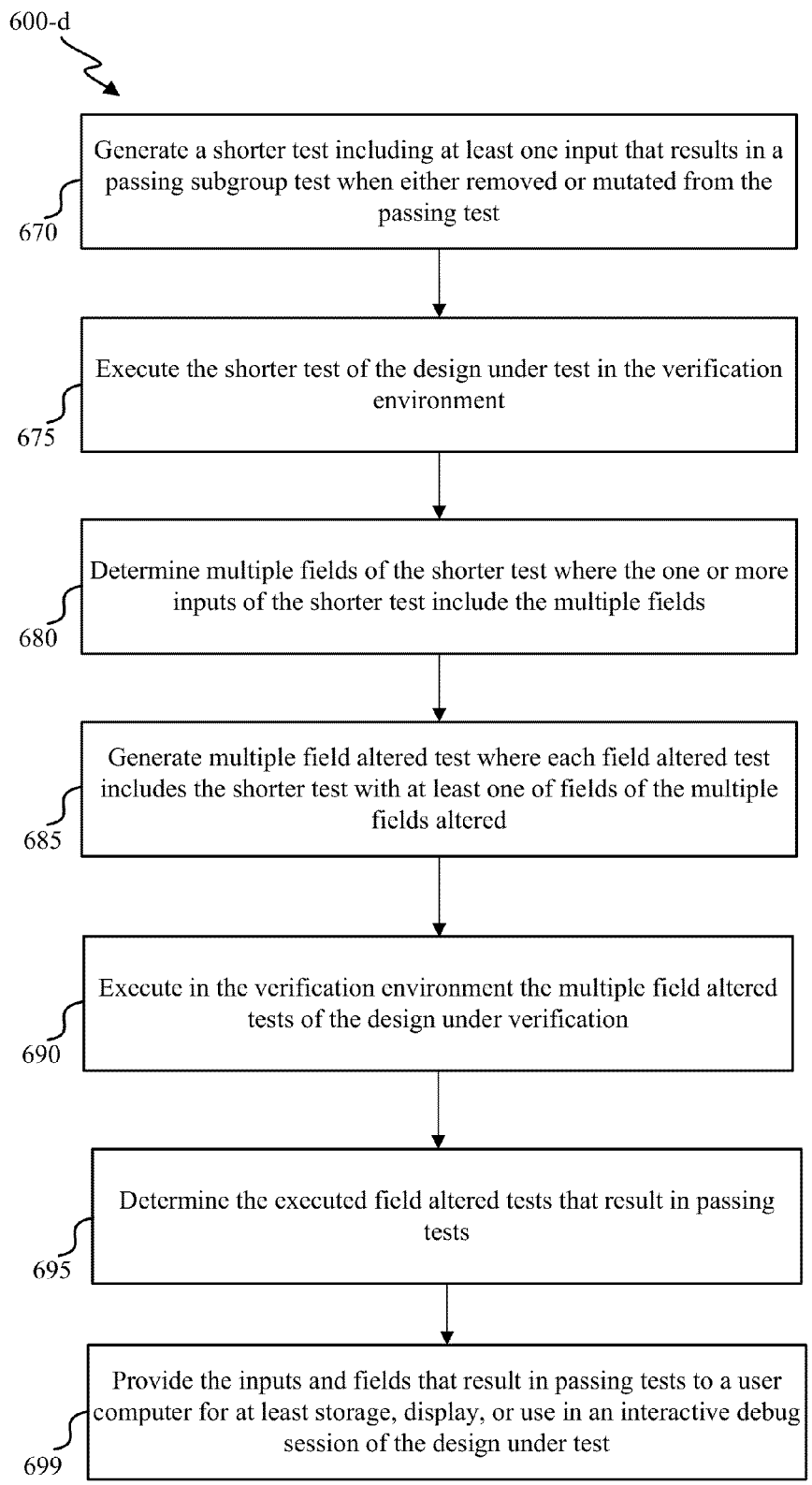
FIG. 6D illustrates a block diagram of a method for automatic debugging of a device under test in a verification environment in accordance with various embodiments.

FIG. 6D provides a block diagram of a method 600-*d* of automated debugging of a design under test in a verification environment of electronic design automation in accordance with various embodiments. Method 600-*d* may be implemented on systems such as systems 100, 400 and/or 500, merely by way of example. Method 600-*d* may be utilized in some embodiments in conjunction with methods 600-*a*, 600-*b*, and/or 600-*c*. At block 670, a shorter test including at least one input that results in a passing subgroup test when altered from the passing test may be generated. At block 675, the shorter test of the design under test may be executed in the verification environment. At block 680, multiple fields of a shorter test may be determined. The one or more inputs of the shorter test may include the multiple fields. At block 685, multiple field altered tests may be generated. Each field altered test may include the shorter test with at least one of the fields of the multiple fields altered. In some embodiments, altering a field may include changing a value of a field. At block 690, the multiple field altered tests of the design under verification may be executed in the verification environment. At block 695, the executed field altered tests that result in passing tests may be determined. At block 699, the inputs and fields that result in passing tests may be provided to a user computer for at least storage, display, or use in an interactive debug session of the design under test.

In some embodiments, a machine-readable storage medium containing program instructions that, when executed by a controller within a computer, cause the controller to execute a method of automated debugging of a design under test in a verification environment is provided. The method may include: identify a failing test of the design under test in the verification environment; determine multiple inputs of the failing test where the verification environment creates the multiple inputs; generate multiple altered tests of the design under test in the verification environment, where each altered test includes the multiple inputs with at least one input altered in the respective altered test; execute in the multiple altered tests of the design under test in the verification environment; and identify at least one executed altered test from the multiple altered tests that result in passing altered test.

In some embodiments, a machine-readable storage medium containing program instructions that, when executed by a controller within a computer, cause the controller to execute a method of automated debugging of a design under test in a verification environment is provided. The method may include: identifying a failing test of the design under test in the verification environment; determining multiple inputs of the failing test; dividing the multiple inputs of the failing test into multiple groups; generating multiple group altered tests of the design under test in the verification environment, wherein each group altered test includes the multiple groups with at least one group altered in the respective group altered test; executing the multiple group altered tests of the design under test in the verification environment; and identifying at least one executed group altered test from the multiple group altered tests that result in passing group altered tests.

Some embodiments of the machine-readable storage medium contain program instructions that, when executed by a controller within a computer, cause the controller to execute a method of automated debugging of a design under test in a verification environment which further include: determining the at least one group altered in at least one passing group altered test; dividing the at least one determined group into multiple subgroups; generating multiple subgroup altered tests, each subgroup altered tests may include the multiple groups with at least one subgroup from the at least one determined group altered in the subgroup altered test; executing in the verification environment the multiple subgroup altered tests of the design under test; and identifying at least one subgroup altered test from the multiple subgroup altered tests that result in passing subgroup test. In some embodiments, the previous steps may be repeated until at least one determined group includes a single input that results in a passing subgroup test.

Some embodiments of the machine-readable storage medium contain program instructions that, when executed by a controller within a computer, cause the controller to execute a method of automated debugging of a design under test in a verification environment which further include: generating a shorter test including at least one input that results in a passing subgroup test when either removed or mutated from the passing tests; and executing in the verification environment the shorter test of the design under test.

Some embodiments of the machine-readable storage medium contain program instructions that, when executed by a controller within a computer, cause the controller to execute a method of automated debugging of a design under test in a verification environment which further include: determining multiple fields of a shorter test, where the one or more inputs of the shorter test include the multiple fields; generating multiple field altered tests, where each field altered test includes the shorter test with at least one of the fields of the multiple fields altered; executing in the verification environment the multiple field altered tests of the design under verification; determining the executed field altered tests that result in passing tests; and providing the inputs and fields that result in passing tests to a user computer for at least storage, display, or use in an interactive debug session of the design under test.

Some embodiments of the machine-readable storage medium contain program instructions that, when executed by a controller within a computer, cause the controller to execute a method of automated debugging of a design under test in a verification environment, altering the at least one group in the respective modified test including removing at least one group in the respective modified test. In some embodiments, altering a field may include changing a value of a field. In some embodiments, each of the multiple groups may consist of one of the multiple inputs.

The previous description provides exemplary embodiments only and is not intended to limit the scope, applicability, or configuration of the disclosure. Rather, the previous description of the exemplary embodiments will provide those skilled in the art with an enabling description for implementing one or more exemplary embodiments. It is understood that various changes may be made in the function and arrangement of elements without departing from the spirit and scope of the invention. Several embodiments were described herein, and while various features are ascribed to different embodiments, it should be appreciated that the features described with respect to one embodiment may be incorporated within other embodiments as well. By the same token, however, no single feature or features of any described embodiment should be considered essential to every embodiment of the invention, as other embodiments of the invention may omit such features.

Specific details are given in the previous description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process may be terminated when its operations are completed, but could have also included additional steps or operations not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

While detailed descriptions of one or more embodiments have been given above, various alternatives, modifications, and equivalents will be apparent to those skilled in the art without varying from the spirit of the invention. Moreover, except where clearly inappropriate or otherwise expressly noted, it should be assumed that the features, devices, and/or components of different embodiments may be substituted and/or combined. Thus, the above description should not be taken as limiting the scope of the invention.

What is claimed is:

1. A method of automated debugging of a design under test in a verification environment, the method comprising:
    identifying, using a computer, a failing test of the design under test in the verification environment;
    determining a plurality of inputs of the failing test, wherein the verification environment creates the plurality of inputs;
    dividing the plurality of inputs of the failing test into a plurality of groups;
    generating a plurality of altered tests of the design under test in the verification environment with each altered test comprising a group altered test comprising the plurality of groups with at least one group altered;
    executing the plurality of altered tests of the design under test in the verification environment;
    identifying at least one altered test from the plurality of altered tests that results in a passing altered test; and
    determining the at least one input altered in each respective altered test that results in the passing altered test.

2. The method for automatic debugging of a design under test in a verification environment of claim 1, further comprising:
    executing the failing test of the design under test in the verification test; and
    recording the plurality of inputs of the executed failing test, wherein the recorded inputs are the determined inputs.

3. The method for automatic debugging of a design under test in a verification environment of claim 1, further comprising:
    determining the at least one group altered in at least one passing group altered test;
    dividing the at least one determined group into a plurality of subgroups;
    generating a plurality of subgroup altered tests, wherein each subgroup altered tests comprises the plurality of groups with at least one subgroup from the at least one determined group altered in the subgroup altered test;
    executing the plurality of subgroup altered tests of the design under test in the verification environment; and
    identifying at least one subgroup altered test from the plurality of subgroup altered tests that result in a passing subgroup test.

4. The method for automatic debugging of a design under test in a verification environment of claim 3, further comprising repeating the steps of claim 3 until at least one determined group comprises a single input that results in the passing subgroup test.

5. The method for automatic debugging of a design under test in a verification environment of claim 4, further comprising:
    generating a shorter test comprising at least one input that results in a passing subgroup test when altered from the passing tests; and
    executing the shorter test of the design under test in the verification environment.

6. The method for automatic debugging of a design under test in a verification environment of claim 1, further comprising:
    determining a plurality of fields of a shorter test, wherein the one or more inputs of the shorter test comprise the plurality of fields;
    generating a plurality of field altered tests, wherein each field altered test comprises the shorter test with at least one of fields of the plurality of fields altered;
    executing the plurality of field altered tests of the design under test in the verification environment;
    determining the executed field altered tests that result in passing tests; and
    providing the inputs and fields that result in passing tests to a user computer for at least storage, display, or use in an interactive debug session of the design under test.

7. The method for automatic debugging of a design under test in a verification environment of claim 6, wherein altering field comprises changing a value of a field.

8. The method for automatic debugging of a design under test in a verification environment of claim 1, wherein altering the at least one input in the respective altered test comprises removing the at least one input in the respective altered test.

9. The method for automatic debugging of a design under test in a verification environment of claim 1, wherein altering the at least one input in the respective altered test comprises modifying the at least one input in the respective altered test.

10. The method for automatic debugging of a design under test in a verification environment of claim 1, wherein each of the plurality of groups consists of one of the plurality of inputs.

11. A system for automated debugging of a design under test in a verification environment, the system comprising:
    a storage medium; and
    a processor coupled with the storage medium, the processor configured for automated debugging of the design under test in a verification environment by a configuration to:

identify a failing test of the design under test in the verification environment;
determine a plurality of inputs of the failing test, wherein the verification environment creates the plurality of inputs;
divide the plurality of inputs of the failing test into a plurality of groups;
generate a plurality of altered tests of the design under test in the verification environment with each altered test comprising a group altered test comprising the plurality of groups with at least one group altered;
execute the plurality of altered tests of the design under test in the verification environment;
identify at least one altered test from the plurality of altered tests that results in a passing altered test; and
determine the at least one input altered in each respective altered test that results in the passing altered test.

12. The system for automated debugging of a design under test in a verification environment of claim 11, wherein the processor is further configured to:
determine the at least one group altered in at least one passing group altered test;
divide the at least one determined group into a plurality of subgroups;
generate a plurality of subgroup altered tests, wherein each subgroup altered tests comprises the plurality of groups with at least one subgroup from the at least one determined group altered in the subgroup altered test;
execute the plurality of subgroup altered tests of the design under test in the verification environment; and
identify at least one subgroup altered test from the plurality of subgroup altered tests that result in a passing subgroup test.

13. The system for automated debugging of a design under test in a verification environment of claim 12, wherein the processor is further configured to:
repeat the steps of claim 12 until at least one determined group comprises a single input that results in a passing subgroup test.

14. The system for automated debugging of a design under test in a verification environment of claim 13, wherein the processor is further configured to:
generate a shorter test comprising at least one input that results in a passing subgroup test when either removed or mutated from the passing tests; and
execute the shorter test of the design under test in the verification environment.

15. The system for automated debugging of a design under test in a verification environment of claim 14, wherein the processor is further configured to:
determine a plurality of fields of a shorter test, wherein the one or more inputs of the shorter test comprise the plurality of fields;
generate a plurality of field altered tests, wherein each field altered test comprises the shorter test with at least one of fields of the plurality of fields altered;
execute the plurality of field altered tests of the design under test in the verification environment;
determine the executed field altered tests that result in passing tests; and
provide the inputs and fields that result in passing tests to a user computer for at least storage, display, or use in an interactive debug session of the design under test.

16. The system for automated debugging of a design under test in a verification environment of claim 15, wherein the processor configured to alter a field comprises changing a value of a field.

17. The system for automated debugging of a design under test in a verification environment of claim 11, wherein the processor configured to alter the at least one group in the respective altered test comprises removing the at least one group in the respective modified test.

18. The system for automated debugging of a design under test in a verification environment of claim 11, wherein altering the at least one input in the respective altered test comprises modifying the at least one input in the respective altered test.

19. The system for automated debugging of a design under test in a verification environment of claim 11, wherein each of the plurality of groups consists of one of the plurality of inputs.

20. A non-transitory machine-readable storage medium containing program instructions that, when executed by a controller within a computer, cause the controller to execute a method of automated debugging of a design under test in a verification environment, the method comprising:
identifying a failing test of the design under test in the verification environment;
determining a plurality of inputs of the failing test, wherein the verification environment creates the plurality of inputs;
dividing the plurality of inputs of the failing test into a plurality of groups;
generating a plurality of altered tests of the design under test in the verification environment with each altered test comprising a group altered test comprising the plurality of groups with at least one group altered;
executing the plurality of altered tests of the design under test in the verification environment;
identifying at least one altered test from the plurality of altered tests that results in a passing altered test; and
determining the at least one input altered in each respective altered test that results in the passing altered test.

21. The machine-readable storage medium containing program instructions that, when executed by a controller within a computer, cause the controller to execute a method of automated debugging of a design under test in a verification environment of claim 20, further comprising:
determining the at least one group altered in at least one passing group altered test;
dividing the at least one determined group into a plurality of subgroups;
generating a plurality of subgroup altered tests, wherein each subgroup altered tests comprises the plurality of groups with at least one subgroup from the at least one determined group altered in the subgroup altered test;
executing the plurality of subgroup altered tests of the design under test in the verification environment; and
identifying at least one subgroup altered test from the plurality of subgroup altered tests that results in a passing subgroup test.

22. The machine-readable storage medium containing program instructions that, when executed by a controller within a computer, cause the controller to execute a method of automated debugging of a design under test in a verification environment of claim 21, further comprising repeating the steps of claim 21 until at least one determined group comprises a single input that results in a passing subgroup test.

23. The machine-readable storage medium containing program instructions that, when executed by a controller within a computer, cause the controller to execute a method of automated debugging of a design under test in a verification environment of claim 22, further comprising:

generating a shorter test comprising at least one input that results in a passing subgroup test when either removed or mutated from the passing tests; and executing the shorter test of the design under test in the verification environment.

24. The machine-readable storage medium containing program instructions that, when executed by a controller within a computer, cause the controller to execute a method of automated debugging of a design under test in a verification environment of claim 22, further comprising:

determining a plurality of fields of a shorter test, wherein the one or more inputs of the shorter test comprise the plurality of fields;

generating a plurality of field altered tests, wherein each field altered test comprises the shorter test with at least one of the fields of the plurality of fields altered;

executing the plurality of field altered tests of the design under test in the verification environment;

determining the executed field altered tests that result in passing tests; and providing the inputs and fields that result in passing tests to a user computer for at least storage, display, or use in an interactive debug session of the design under test.

25. The machine-readable storage medium containing program instructions that, when executed by a controller within a computer, cause the controller to execute a method of automated debugging of a design under test in a verification environment of electronic design automation of claim 24, wherein altering field comprises changing a value of a field.

26. The machine-readable storage medium containing program instructions that, when executed by a controller within a computer, cause the controller to execute a method of automated debugging of a design under test in a verification environment of claim 20, wherein altering the at least one group in the respective altered test comprises removing the at least one group in the respective altered test.

27. The machine-readable storage medium containing program instructions that, when executed by a controller within a computer, cause the controller to execute a method of automated debugging of a design under test in a verification environment of claim 20, wherein altering the at least one input in the respective altered test comprises modifying the at least one input in the respective altered test.

28. The machine-readable storage medium containing program instructions that, when executed by a controller within a computer, cause the controller to execute a method of automated debugging of a design under test in a verification environment of claim 22, wherein each of the plurality of groups consists of one of the plurality of inputs.

* * * * *